(12) United States Patent
Ikemoto et al.

(10) Patent No.: US 9,685,376 B2
(45) Date of Patent: Jun. 20, 2017

(54) SEMICONDUCTOR DEVICE AND METHOD OF MANUFACTURING SEMICONDUCTOR DEVICE

(71) Applicant: J-DEVICES CORPORATION, Usuki-shi, Oita (JP)

(72) Inventors: Yoshihiko Ikemoto, Yokohama (JP); Hiroshi Inoue, Yokohama (JP); Kiminori Ishido, Yokohama (JP); Hiroaki Matsubara, Yokohama (JP); Yukari Imaizumi, Yokohama (JP)

(73) Assignee: J-DEVICES CORPORATION, Usuki-shi, Oita (JP)

( * ) Notice: Subject to any disclaimer, the term of this patent is extended or adjusted under 35 U.S.C. 154(b) by 0 days.

(21) Appl. No.: 14/801,437

(22) Filed: Jul. 16, 2015

(65) Prior Publication Data

US 2016/0027695 A1    Jan. 28, 2016

(30) Foreign Application Priority Data

Jul. 23, 2014 (JP) .................................. 2014-149989

(51) Int. Cl.
*H01L 23/24* (2006.01)
*H01L 21/44* (2006.01)
(Continued)

(52) U.S. Cl.
CPC .............. *H01L 21/78* (2013.01); *H01L 24/19* (2013.01)

(58) Field of Classification Search
CPC ....... H01L 24/16; H01L 23/481; H01L 24/19; H01L 21/78; H01L 2224/03002
(Continued)

(56) References Cited

U.S. PATENT DOCUMENTS 6,770,971 B2 *  8/2004  Kouno ................ H01L 23/3114
                                                       252/514
7,514,335 B2 *  4/2009  Wakabayashi ........ H01L 21/568
                                                       438/411
(Continued)

FOREIGN PATENT DOCUMENTS

JP    2003-197662 A    7/2003
JP    2010-219489 A    9/2010

OTHER PUBLICATIONS

Taiwanese Office Action dated Jun. 3, 2016 (9 pages).
English language Concise Explanation of Relevance (2 pages).

*Primary Examiner* — Luan C Thai
(74) *Attorney, Agent, or Firm* — Flynn, Thiel, Boutell & Tanis, P.C.

(57) ABSTRACT

A semiconductor device including: a support plate 1; a semiconductor chip 2 mounted on one principal surface of the support plate 1 via an adhesive layer, with the element circuit surface of the chip being directed upward; an insulation material layer 4 that seals the semiconductor chip 2 and the periphery of the semiconductor chip; openings formed on an electrode arranged on the element circuit surface of the semiconductor chip 2 in the insulation material layer 4; conductive portions 6 formed in the openings so as to be connected to the electrode of the semiconductor chip; a wiring layer 5 formed on the insulation material layer 4 so as to be connected to the conductive portions 6 and partially extending to the peripheral region of the semiconductor chip 2; and external electrodes 7 formed on the wiring layer 5.

10 Claims, 20 Drawing Sheets

(51) Int. Cl.
*H01L 21/78* (2006.01)
*H01L 23/00* (2006.01)

(58) Field of Classification Search
USPC .......................................... 257/687; 438/106
See application file for complete search history.

(56) References Cited

U.S. PATENT DOCUMENTS

| | | | |
|---|---|---|---|
| 7,723,838 B2 * | 5/2010 | Takeuchi | H01L 21/568 |
| | | | 257/700 |
| 8,692,363 B2 * | 4/2014 | Koizumi | H01L 23/5389 |
| | | | 257/678 |
| 2005/0161833 A1 | 7/2005 | Takeuchi et al. | |
| 2012/0119379 A1 | 5/2012 | Koizumi et al. | |

* cited by examiner

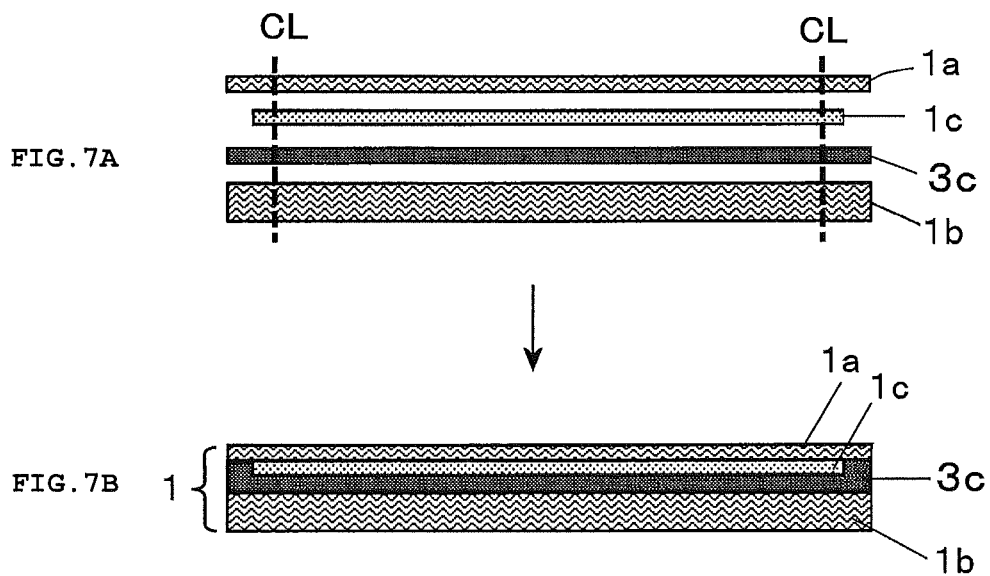

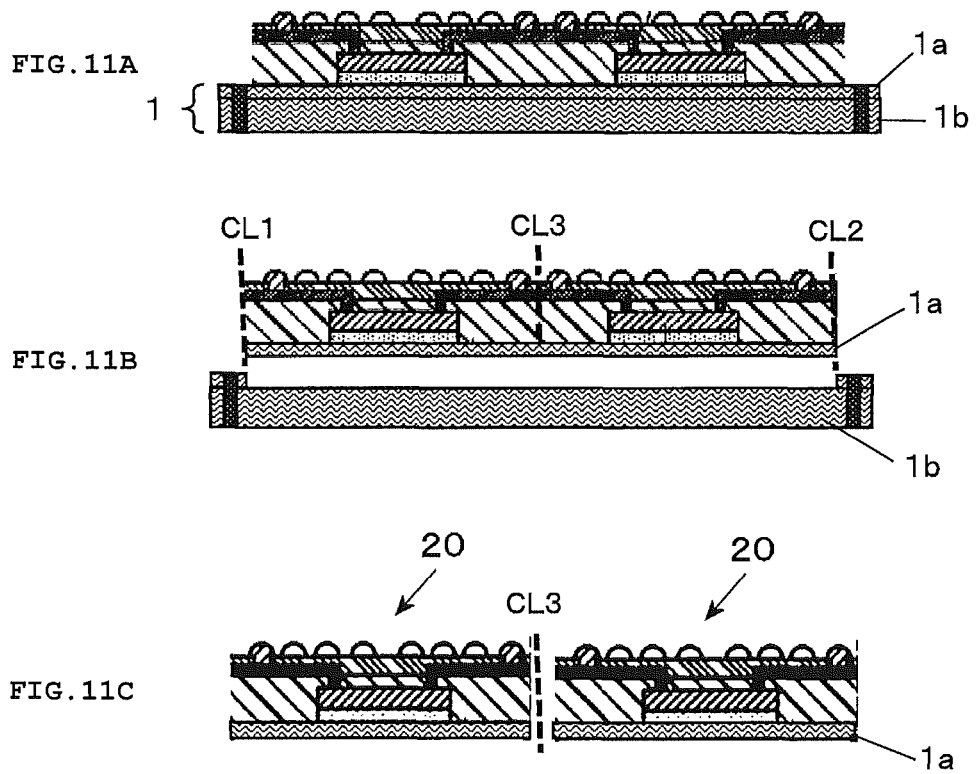

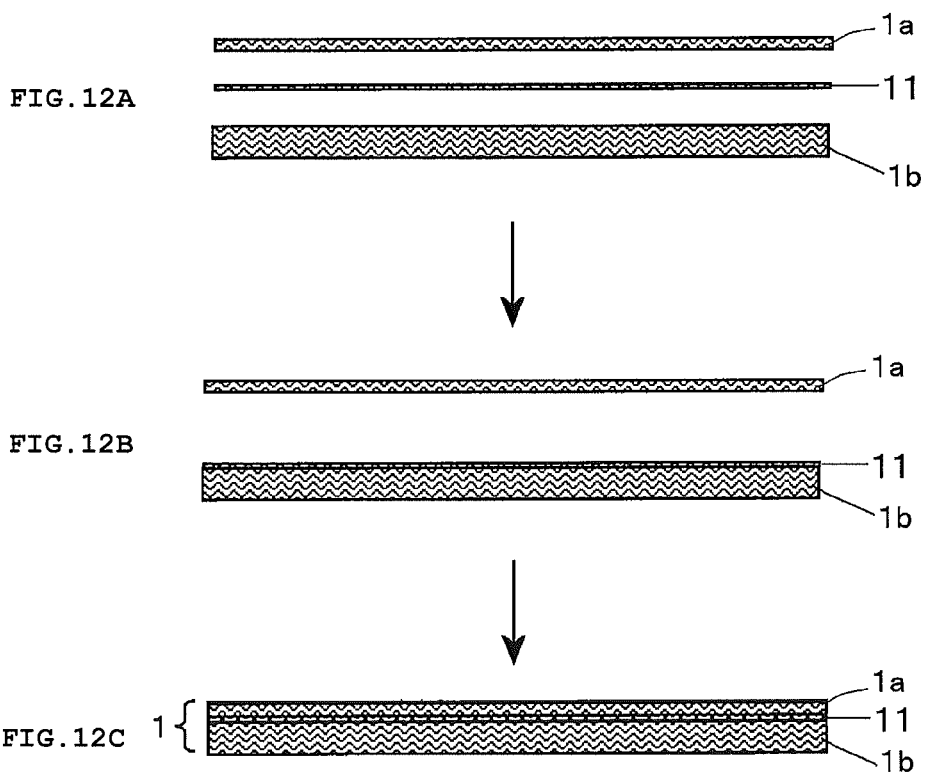

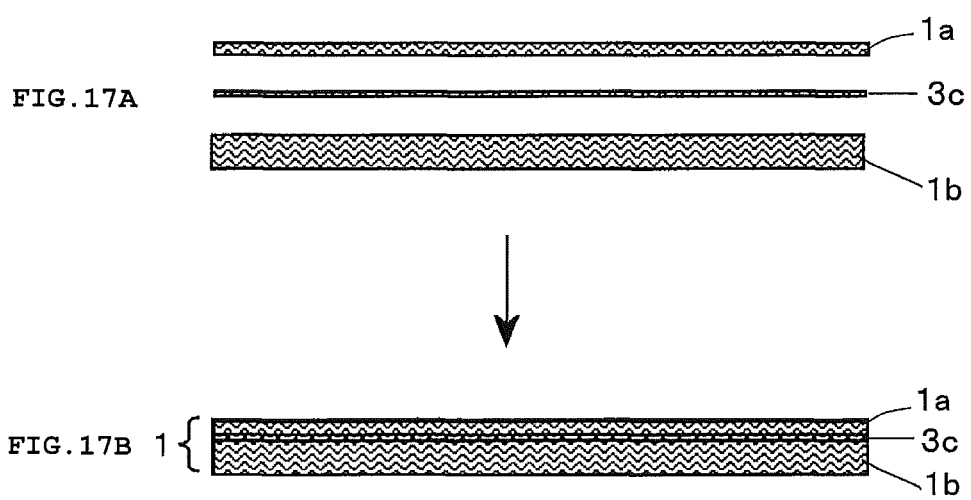

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method of manufacturing the semiconductor device and, in particular, to a semiconductor device that has a Panel scale Fan-out package structure in which a thin film wiring step and an assembling step are performed on a large panel scale, and a method of manufacturing the semiconductor device.

2. Description of the Related Art

With a demand for the high functionality and miniaturization of electronic equipment in recent years, electronic components have been increasingly integrated and mounted at a higher density. Thus, semiconductor devices used in electronic equipment have been more reduced in size than ever before.

As a method of manufacturing semiconductor devices such as LSI units and IC modules, the following method has been known (see, for example, Japanese Patent Publication No. 2003-197662). First, a plurality of semiconductor chips determined to be nondefective according to an electrical characteristics test is arranged and bonded onto a retention plate in a prescribed arrangement with the element circuit surfaces thereof directed downward. After that, a resin sheet is, for example, arranged on the semiconductor chips and heated and pressed to be molded. Thus, the plurality of semiconductor chips is sealed in a lump by a resin. Next, after the retention plate is separated and the resin sealed body is cut off and processed into a prescribed shape (for example, a circular shape), an insulation material layer is formed on the element circuit surfaces of the semiconductor chips embedded in the resin sealed body. Then, openings are formed in the insulation material layer so as to suit the electrode pads of the semiconductor chips. After that, a wiring layer is formed on the insulation material layer, while conduction portions (via portions) are formed in the openings so as to be connected to the electrode pads of the semiconductor chips. Next, a solder resist layer and solder balls that serve as external electrode terminals are sequentially formed. Then, the semiconductor chips are cut off one by one and segmented into pieces to complete the semiconductor devices.

However, in the conventional semiconductor devices thus obtained, the resin is cured to shrink when the plurality of semiconductor chips is sealed at the same time by the resin and its shrinking amount is not necessarily equal to the designed one. Therefore, after the resin is cured, the semiconductor chips are likely to deviate from designed positions depending on the arrangement positions thereof. In the semiconductor chips in which a positional deviation occurs, the via portions formed in the openings of the insulation material layer and the electrode pads of the semiconductor chips deviate from each other, which results in a problem that the connection reliability is reduced.

Japanese Patent Publication No. 2010-219489 describes a semiconductor device that addresses the problem.

FIG. 20 shows the basic structure of the device.

A semiconductor device 20 has a support plate 1 constituted by a resin cured body or metal. A semiconductor chip 2 is arranged on one principal surface of the support plate 1 with the element circuit surface (front side surface) thereof directed upward, and the surface (rear side surface) opposite to the element circuit surface bonded onto the support plate 1 via an adhesive 3. Further, an insulation material layer 4 is singly formed on the entire principal surface of the support plate 1 so as to cover the element circuit surface of the semiconductor chip 2. A wiring layer 5 made of a conductive metal such as copper is formed on the single insulation material layer 4 and partially withdrawn to the peripheral region of the semiconductor chip 2. In addition, conduction portions (via portions) 6 that electrically connect the electrode pads (not shown) of the semiconductor chip 2 and the wiring layer 5 to each other are formed in the insulation material layer 4 formed on the element circuit surface of the semiconductor chip 2. The conductive portions 6 are formed in a lump to be integrated with the wiring layer 5. Moreover, a plurality of external electrodes 7, such as solder balls, are formed at the prescribed positions of the wiring layer 5. Further, a wiring protection layer (solder resist layer) 8 is formed on the insulation material layer 4 and the wiring layer 5 that does not include the connection parts of the external electrodes 7 such as solder balls.

The device greatly contributes to the high density and the miniaturization of electronic equipment for which the demand has been further increased in recent years.

Meanwhile, it is described in Japanese Patent Publication No. 2010-219489 that a resin cured body made of a cured resin or a flat plate that has a uniform thickness and is made of metal such as stainless steel and a 42 alloy is used as the support plate 1 of the semiconductor device 20. However, the support plate integrated with the semiconductor device plays a role as a product conveyance carrier in a manufacturing step while functioning as a stiffener, a radiation plate, and an electromagnetic shield, and thus a thick stainless steel is generally used to facilitate the handling of a panel, reduce warpage, and facilitate segmentation. This results in the problem that the semiconductor device as a final product is thickened and radiation becomes poor since a material having an excellent heat conduction cannot be selected as a material of the support plate 1. Therefore, it has been difficult to lower the height of (thin) the semiconductor device.

When SUS304 is, for example, used as the support plate (radiation plate) 1, the heat conductivity (16.7 [W/mK]) of the SUS304 is $\frac{1}{20}$ or lower than the heat conductivity (about 400 W/mK) of copper generally used as a radiation plate. Therefore, the radiation of the SUS304 is poor, and the effect of reducing PKG heat resistance is small. Further, when a SUS that has a thickness of 0.3 mm is used to reduce the warpage of the support plate, it cannot be applied to a mobile product since its attachment height becomes high.

In addition, it is described in Japanese Patent Publication No. 2010-219489 that the thickness of the semiconductor devices may be reduced by, for example, the mechanical polishing of the surface opposite to the semiconductor-chip mounting surface of the support plate before cutting off and segmenting the semiconductor devices into pieces. However, a specific manufacturing method is not described in Japanese Patent Publication No. 2010-219489, and there are concerns about fluctuations in the polishing and quality reduction due to stress loads to the semiconductor devices. Therefore, it is difficult to put the method of the reduction in the thickness of the semiconductor devices into practical use.

SUMMARY OF THE INVENTION

Problems to be Solved by the Invention

An object of the present invention is to provide a semiconductor device low in height and a method of manufacturing the semiconductor device.

Another object of the present invention is to provide a semiconductor device low in heat resistance and a method of manufacturing the semiconductor device.

After an intensive study, the present inventors have come to the conclusion that the above problems can be addressed by thinning a support plate on which a semiconductor chip is mounted to obtain a semiconductor device having a low height and by using a combined support plate in which flat plates having a low heat conduction are combined with each other to obtain a semiconductor device having a low heat resistance and thus have completed the present invention.

That is, the details of the present invention are as follows.

(1) A semiconductor device including:

a support plate;

a semiconductor chip mounted on one principal surface of the support plate via an adhesive layer, with an element circuit surface of the chip being directed upward;

an insulation material layer that seals the semiconductor chip and a periphery of the semiconductor chip;

openings formed on an electrode arranged on the element circuit surface of the semiconductor chip in the insulation material layer;

conductive portions formed in the openings so as to be connected to the electrode of the semiconductor chip;

a wiring layer formed on the insulation material layer so as to be connected to the conductive portions and partially extending to a peripheral region of the semiconductor chip; and external electrodes formed on the wiring layer, wherein the support plate is a flat plate that has the semiconductor chip mounted thereon and is separated from other flat plates that constitute a combined support plate, the flat plate constituting the combined support plate in which the plurality of flat plates used in a process of manufacturing the semiconductor device is laminated to each other.

(2) A method of manufacturing the semiconductor device according to (1), the method including:

a step of laminating a plurality of flat plates to each other to manufacture a combined support plate;

a step of positioning and arranging a plurality of semiconductor chips on a principal surface of a first flat plate that constitutes the combined support plate and bonding surfaces opposite to element circuit surfaces of the semiconductor chips via an adhesive;

a step of forming an insulation material layer on the element circuit surfaces of the semiconductor chips and the principal surface of the first flat plate;

a step of forming openings in the insulation material layer at positions on the electrodes arranged on the element circuit surfaces of the semiconductor chips;

a step of forming a wiring layer that partially extends to peripheral regions of the semiconductor chips on the insulation material layer, and forming conductive portions connected to the electrodes of the semiconductor chips in the openings of the insulation material layer;

a step of forming external electrodes on the wiring layer;

a step of cutting off the first flat plate and the insulation material layer at prescribed positions to segment the semiconductor devices that include the one or the plurality of semiconductor chips into pieces; and a step of separating a flat plate other than the first flat plate among the plurality of flat plates that constitutes the combined support plate from the semiconductor devices before or after the step of segmenting the semiconductor devices that include the one or the plurality of semiconductor chips into the pieces.

(3) The method of manufacturing the semiconductor device according to (2), wherein the combined support plate is obtained by laminating the first flat plate and a second flat plate to each other via the adhesive, and the adhesive is removed to separate the flat plate other than the first flat plate from the semiconductor devices.

(4) The method of manufacturing the semiconductor device according to (3), wherein the adhesive between the first flat plate and the second flat plate is provided along cut lines used to segment the semiconductor devices that include the one or the plurality of semiconductor chips into the pieces and this adhesive between the first flat plate and the second flat plate is cut off together with the first flat plate and the insulation material layer when the semiconductor devices that include the one or the plurality of semiconductor chips are segmented into the pieces, thereby separating the first flat plate and the second flat plate from each other.

(5) The method of manufacturing the semiconductor device according to (4), wherein concave portions are provided in the second flat plate along the cut lines, and the adhesive is provided in the concave portions.

(6) The method of manufacturing the semiconductor device according to (2), wherein the combined support plate is obtained by laminating the first flat plate, a third flat plate, and a second flat plate to each other in this order, the third flat plate is smaller in area than the first flat plate and the second flat plate, the second flat plate and the third flat plate are bonded together via the adhesive, the first flat plate and the third flat plate come into direct contact with each other without the adhesive, a regional part of the second flat plate in which the third flat plate does not exist and a regional part of the first flat plate in which the third flat plate does not exist are bonded together via the adhesive, and a regional part in which the first flat plate, the third flat plate, and the second flat plate are laminated to each other is cut off together with the first flat plate and the insulation material layer when the semiconductor devices that include the one or the plurality of semiconductor chips are segmented into the pieces, thereby separating the first flat plate from the third flat plate and the second flat plate.

(7) The method of manufacturing the semiconductor device according to (2), wherein the combined support plate is laminated in such a way that the first flat plate and a second flat plate are welded to each other at outer peripheral parts thereof in a state of coming into intimate contact with each other, and the outer peripheral parts in which the first flat plate and the second flat plate are welded to each other are cut off and removed when the semiconductor devices that have the one or the plurality of semiconductor chips are segmented into the pieces, thereby separating the first flat plate and the second flat plate from each other.

(8) The method of manufacturing the semiconductor device according to (3), wherein the combined support plate has the first flat plate and the second flat plate bonded together via a temporary fixation film that has adhesion, and the first flat plate is separated from the temporary fixation film when the semiconductor devices that include the one or the plurality of semiconductor chips are segmented into the pieces, thereby separating the first flat plate and the second flat plate from each other.

(9) A semiconductor device including:

a combined support plate in which a plurality of flat plates are laminated to each other;

a semiconductor chip mounted on a principal surface of a first flat plate via an adhesive layer, with an element circuit surface of the chip being directed upward and the first flat plate constituting an outermost layer of the combined support plate;

an insulation material layer that seals the semiconductor chip and a periphery of the semiconductor chip;

openings formed on an electrode arranged on the element circuit surface of the semiconductor chip in the insulation material layer;

conductive portions formed in the openings so as to be connected to the electrode of the semiconductor chip;

a wiring layer formed on the insulation material layer so as to be connected to the conductive portions and partially extending to a peripheral region of the semiconductor chip; and external electrodes formed on the wiring layer, wherein the first flat plate is made of a material that has the highest heat conduction among the flat plates that constitute the combined support plate.

(10) A method of manufacturing the semiconductor device according to (9), the method including:

a step of laminating a first flat plate and other flat plates to each other to manufacture a combined support plate, the first flat plate being made of a material that has the highest heat conduction among the plurality of flat plates and serving as an outermost layer;

a step of positioning and arranging a plurality of semiconductor chips on a principal surface of the first flat plate and bonding surfaces opposite to element circuit surfaces of the semiconductor chips via an adhesive;

a step of forming an insulation material layer on the element circuit surfaces of the semiconductor chips and the principal surface of the first flat plate;

a step of forming openings in the insulation material layer at positions on the electrodes arranged on the element circuit surfaces of the semiconductor chips;

a step of forming a wiring layer that partially extends to peripheral regions of the semiconductor chips on the insulation material layer and forming conductive portions connected to the electrodes of the semiconductor chips in the openings of the insulation material layer;

a step of forming external electrodes on the wiring layer; and a step of cutting off the first flat plate and the insulation material layer at prescribed positions to segment the semiconductor devices that include the one or the plurality of semiconductor chips into pieces.

The semiconductor device of the present invention can produce the following effects:

Radiation is improved (low heat resistance).

With a reduction in PKG thickness, mobile products or the like can be applied in a broader range.

Even if the PKG thickness is reduced, warpage can be prevented like conventional products.

BRIEF DESCRIPTION OF THE DRAWINGS

FIGS. 7A and 7B are cross-sectional views showing a configuration example of the combined support plate used in the method of manufacturing the semiconductor device according to the present invention;

FIGS. 11A to 11C are cross-sectional views showing the step of segmenting the semiconductor devices according to the present invention into pieces;

FIGS. 12A to 12C are cross-sectional views showing a configuration example of the combined support plate used in the method of manufacturing the semiconductor device according to the present invention;

FIGS. 17A and 17B are cross-sectional views showing a configuration example of a combined support plate in the semiconductor device according to the present invention;

DETAILED DESCRIPTION OF THE PREFERRED EMBODIMENTS

Hereinafter, embodiments for carrying out the present invention will be described. Note that although the embodiments will be described based on the drawings in the following description, the drawings are given for illustration purposes and the present invention is not limited to the drawings.

First Embodiment

Figure 1:
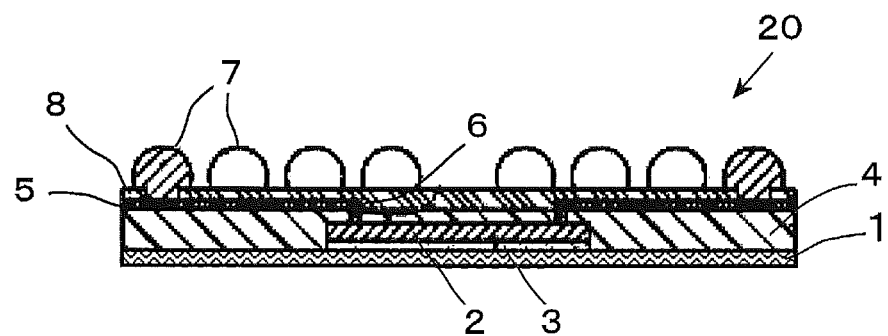
FIG. 1 is a cross-sectional view showing a configuration example of a semiconductor device according to the present invention.

FIG. 1 is a vertical cross-sectional view showing an embodiment of a semiconductor device according to the present invention.

A semiconductor device 20 shown in FIG. 1 has a support plate 1, a semiconductor chip 2, an insulation material layer 4, a wiring layer 5, and external electrodes 7.

The semiconductor chip 2 is arranged on the principal surface of the support plate 1 with the element circuit surface thereof having an electrode (not shown) directed upward and bonded via an adhesive 3 onto the support plate 1 at the surface (rear surface) thereof opposite to the element circuit surface.

On the entire principal surface of the support plate 1, the insulation material layer 4 is formed so as to cover the element circuit surface of the semiconductor chip 2. The wiring layer 5 that constitutes wiring is made of a conductive metal such as copper and formed on the insulation material layer 4 and partially withdrawn to the peripheral region of the semiconductor chip 2. The insulation material layer on the electrode of the semiconductor chip 2 has openings, and conductive portions 6 are formed in the openings to electrically connect the wiring layer 5 and the electrode to each other. In addition, the plurality of external electrodes 7 such as solder balls is formed at the prescribed positions of the wiring layer 5.

On the insulation material layer 4 and the wiring layer 5 that does not include the bonding parts of the external electrodes 7, a wiring protection layer 8 is formed. The wiring protection layer 8 may be made of a material the same as or different from the insulation material of the insulation material layer 4.

In the process of manufacturing the semiconductor device of the embodiment, a combined support plate in which a plurality of flat plates is laminated to each other is used as the support plate. In the semiconductor device, warpage occurs due to a difference in the heat expansion coefficient between members when the semiconductor device is heated in the manufacturing process. The support plate requires a certain degree of stiffness to prevent the warpage. Therefore, when SUS is, for example, employed as a material of the support plate, a support plate that has a thickness of about 0.3 mm has been conventionally used. However, when the support plate has a thickness of about 0.3 mm, the mounting height of the semiconductor device becomes high as a product and thus the semiconductor device is not suitably used in a mobile product.

In view of this, in the embodiment, the thick combined support plate in which the plurality of flat plates are laminated to each other and used as the support plate in the process of manufacturing the semiconductor device, and a flat plate other than a flat plate (called a first flat plate) on which the semiconductor chip is mounted is finally separated from the first flat plate to make only the first flat plate remain in the semiconductor device. Thus, a semiconductor device that is free from warpage and has a low height can be obtained.

Since other flat plates laminated on the first flat plate are responsible for the stiffness that the support plate is required to have in order to prevent the warpage, the first flat plate may be thin. Therefore, the finally-obtained semiconductor device can be made thinner. The first flat plate may be made of a material the same as or different from those of other flat plates. For example, when a flat plate other than the first flat plate is made of SUS, the first flat plate may be made of a material having an excellent conduction, such as copper. The first flat plate made of a material having an excellent conduction, such as copper, effectively functions as the radiation plate of the semiconductor device.

Second Embodiment

Figure 2:
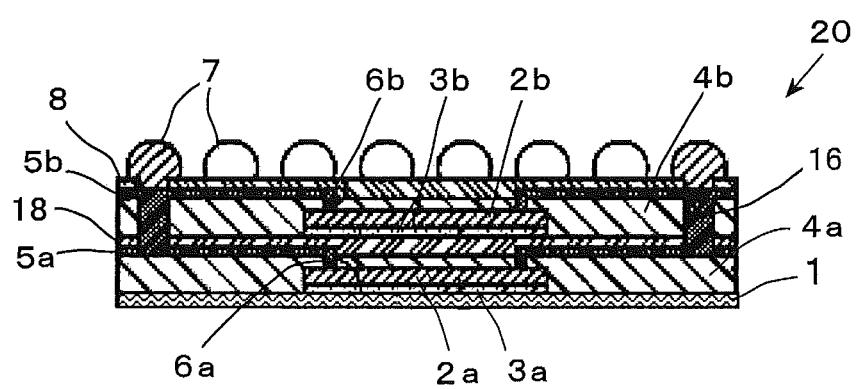
FIG. 2 is a cross-sectional view showing a configuration example of a semiconductor device according to the present invention.

FIG. 2 is a cross-sectional view showing a second embodiment of the present invention.

A semiconductor device 20 of the embodiment has a structure in which two semiconductor chips 2 (a first semiconductor chip 2a and a second semiconductor chip 2b) are laminated and arranged. The first semiconductor chip 2a is bonded onto one principal surface of a flat plate 1 the same as that of the first embodiment with the element circuit surface thereof directed upward, an insulation material layer (first insulation material layer) 4a is formed on the first semiconductor chip 2a so as to cover the same, and a first wiring layer 5a that has conductive portions 6a on the electrode of the first semiconductor chip 2a is formed on the insulation material layer 4a. Further, an interlayer insulation protection layer 18 is formed on the first insulation material layer 4a and the first wiring layer 5a that does not include the connection parts (interlayer via connection parts) of interlayer via portions 16 that will be described later.

Moreover, the second semiconductor chip 2b is bonded onto the interlayer insulation protection layer 18 with the element circuit surface thereof directed upward, and an insulation material layer (second insulation material layer) 4b is formed so as to cover the second semiconductor chip 2b. Note that the second insulation material may be the same as or different from the first insulation material.

Further, a second wiring layer 5b is formed on the second insulation material layer 4b, and conductive portions 6b that electrically connect the second wiring layer 5b and the electrode of the second semiconductor chip 2b to each other are formed. In addition, in the peripheral region of the second semiconductor chip 2b, openings are formed in the second insulation material layer 4b so as to suit via connection parts opened and formed in the interlayer insulation protection layer 18, and the interlayer via portions 16 that electrically connect the first wiring layer 5a and the second wiring layer 5b to each other are formed in the openings. Moreover, external electrodes 7 such as solder balls are formed at the prescribed positions of the second wiring layer 5b, and a wiring protection layer 8 is formed on the second insulation material layer 4b and the second wiring layer 5b that does not include the connection parts of the external electrodes 7.

In the second embodiment thus configured, the semiconductor device that has the structure in which the two semiconductor chips 2a and 2b are laminated and arranged, has the high connection reliability between the electrodes of the respective semiconductor chips 2 and the wiring layers, and is capable of responding to the miniaturization of the electrodes can be obtained at a high yield and a low cost.

Note that although the second embodiment shows the structure in which the two semiconductor chips 2 are laminated and arranged, a structure in which three or more semiconductor chips are laminated and arranged may be employed. In the case of the structure in which three or more semiconductor chips are laminated to each other, the same structures as the structure in which the second semiconductor chip 2b, the second insulation material layer 4, the second wiring layer 5b, and the interlayer via portions 16 are laminated to each other are laid one on another by the number of the semiconductor chips. Further, a wiring protection layer is formed on the outermost wiring layer, and the external electrodes 7 are formed at prescribed positions. In this way, the semiconductor device is completed.

The method of manufacturing the semiconductor device 20 of the first embodiment will be described below as an embodiment.

In the manufacturing method that will be described below, the support plate 1 is much greater in size than the semiconductor chips 2 of the present invention, and the plurality of semiconductor chips 2 is mounted on the support plate 1 with an interval placed therebetween and subjected to prescribed treatment steps to simultaneously manufacture the plurality of semiconductor devices. The plurality of semiconductor devices are finally segmented into separate semiconductor devices. As a result, the plurality of semiconductor devices can be obtained.

Since the plurality of semiconductor devices are simultaneously manufactured in this way, it becomes possible to remarkably reduce the manufacturing cost.

In addition, although the semiconductor device that has one semiconductor chip on the support plate will be described in the following embodiment, a case in which a plurality of semiconductor chips are formed on the support plate is also an embodiment of the present invention.

Third Embodiment

A third embodiment of the method of manufacturing the semiconductor device shown in the first embodiment will be described based on FIG. 3 to FIGS. 5A and 5B.

Figure 3:
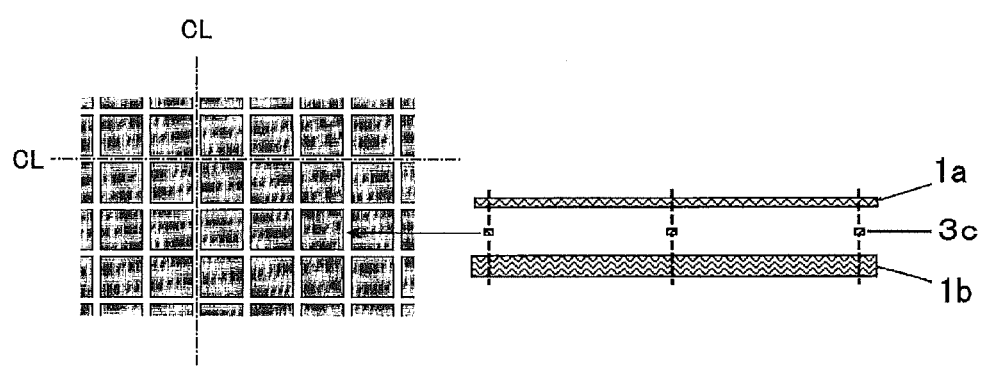
FIG. 3 is a cross-sectional view showing a configuration example of a combined support plate used in a method of manufacturing the semiconductor device according to the present invention.

FIG. 3 is a view showing the configuration of the combined support plate.

The combined support plate 1 is laminated in such a way that a first flat plate 1a and a second flat plate 1b are bonded together via an adhesive 3c. As shown in the left part of FIG. 3, the adhesive 3c is provided along cut lines CL used for the segmentation of the semiconductor devices.

The first flat plate 1a and the second flat plate 1b are flat plates that have a uniform thickness and are constituted by a resin cured body made of a cured insulation resin or metal such as stainless steel and 42 alloy. The combined support plate 1 should be such that the total thickness of the first flat plate 1a and the second flat plate 1b is a thickness at which warpage does not occur due to the formation of the insulation material layer that will be described later. Since only the first flat plate 1a among the flat plates that constitute the combined support plate 1 is used as a component of the semiconductor device, the thickness of the first flat plate is preferably thin.

FIGS. 4A to 4E are views showing the steps of manufacturing the semiconductor devices before segmentation.

Figure 4A:
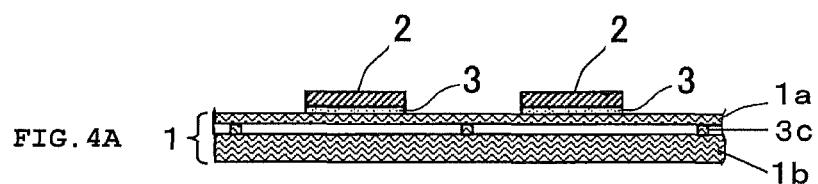
FIGS. 4A to 4E are cross-sectional views showing a part of the steps of the method of manufacturing the semiconductor device according to the present invention.

FIG. 4A is a view showing a state in which the semiconductor chips 2 are bonded and mounted via the adhesive 3 onto the support plate 1 in which the first flat plate 1a and the second flat plate 1b are bonded together via the adhesive 3c.

First, as shown in FIG. 4A, the plurality of semiconductor chips 2 are bonded via the adhesive 3 onto one principal surface of the support plate 1a. At this time, the element circuit surfaces of the semiconductor chips 2 are directed upward, and the other principal surfaces opposite to the element circuit surfaces are bonded onto the support plate 1a. In addition, the plurality of semiconductor chips 2 are arranged with a prescribed interval placed therebetween.

Figure 4B:
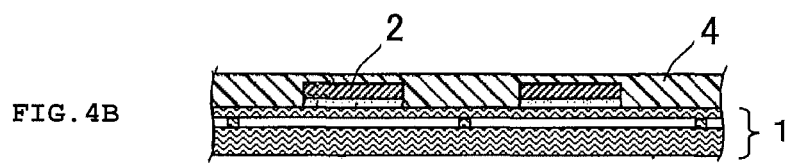

Next, as shown in FIG. 4B, the insulation material layer 4 is formed on the element circuit surfaces of the semiconductor chips 2 and the support plate 1 on the peripheries of the semiconductor chips 2.

As an insulation material, an insulative resin such as a heat-curable resin can be, for example, used. The insulation material can be supplied based on a coating method using a spin coater, a printing method using a squeegee, a method of laminating a film-like resin, or the like. In addition, it is possible to use a photosensitive resin as the insulative resin.

Figure 4C:
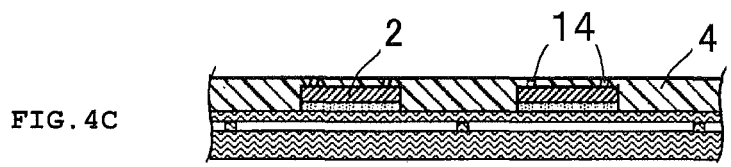

Then, as shown in FIG. 4C, openings 14 are partially formed in the insulation material layer 4 formed on the semiconductor chips 2. Thus, the element circuit surfaces of the semiconductor chips 2 are exposed to be capable of functioning as electrodes that electrically connect the semiconductor chips 2 and other elements to each other. Means for forming the openings 14 is not particularly limited, and the openings 14 can be formed, for example, by the exposure and development of a photosensitive resin or by laser beams.

Figure 4D:
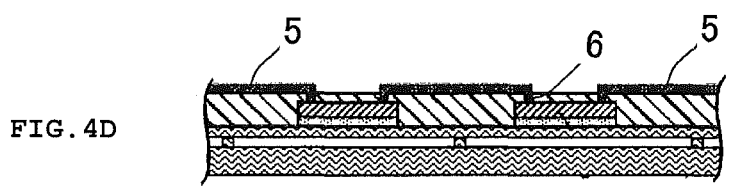

As shown in FIG. 4D, the wiring layer 5 is formed on the insulation material layer 4. For example, the wiring layer 5 can be formed in such a way that a base (seed layer) is formed on the entire upper surface of the insulation material layer 4 based on a deposition method (sputtering method), electroless plating, or the like and then subjected to electroplating. At this time, as shown in FIG. 4D, a conductive metal thin film layer is also formed based on plating on the side walls of the openings 14 of the insulation material layer 4, and thus the conductive portions 6 that electrically connect the semiconductor chips 2 and the wiring layer 5 to each other are formed. Further, the metal thin film layer formed on the entire surface is patterned based on photolithography, whereby the wiring layer 5 that partially extends to the peripheral regions of the semiconductor chips 2 can be formed.

Note that the conductive portions 6 may be filled with a conductive material or an insulation material to form the insulation material layer 4 that will be described later may be formed on the plated film of the side walls. When the conductive portions 6 are filled with a conductive material, they may be filled in a lump at the plating or a conductive paste may be filled after the plated film is formed on the side walls.

The patterning by photolithography described above is not particularly limited, and the wiring layer 5 can be formed based on, for example, a subtractive method that will be described below. The subtractive method can be performed in such a way that a photosensitive resist layer is formed on the metal thin film layer, exposed and developed with a mask having a prescribed pattern, and the metal thin film layer is etched. In addition, the base (seed layer) described above is removed based on etching after the formation of the wiring layer 5.

Figure 4E:
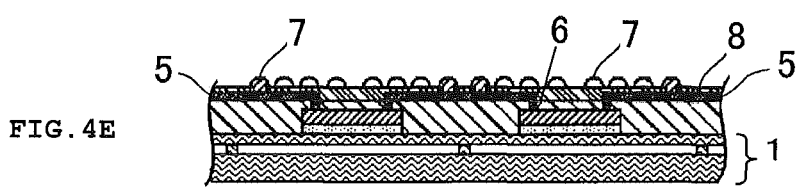

Next, as shown in FIG. 4E, the wiring protection layer (solder resist layer) 8 is formed on the wiring layer 5, the conductive portions 6, and the insulation material layer 4. The wiring protection layer 8 may be made of a material the same as or different from that of the insulation material layer 4.

After the formation of the wiring protection layer 8, opening parts are formed in the wiring protection layer 8 to provide the external electrodes 7, and a conductive material is provided in the opening parts to form the external electrodes 7. As the conductive material, a solder ball, a conductive paste, a solder paste, or the like is used.

Figures 5A, 5B:
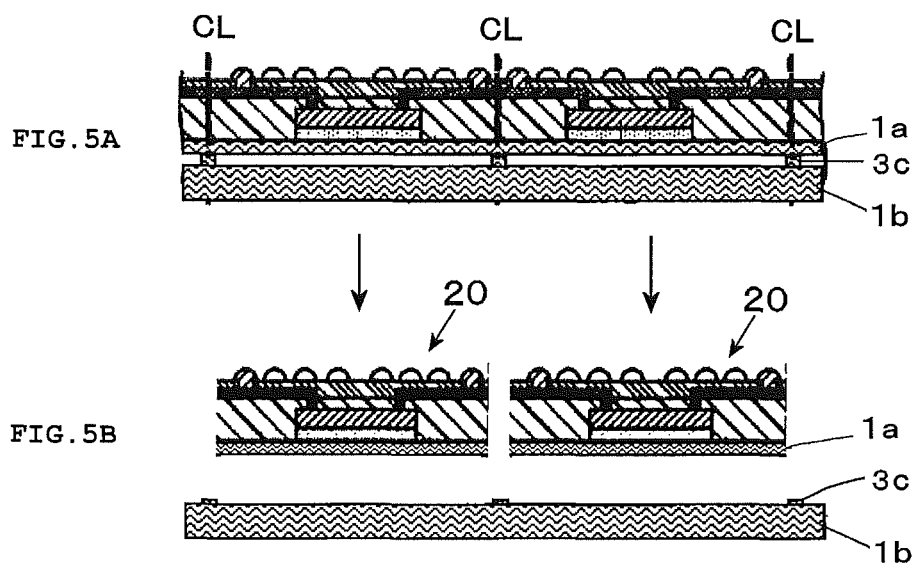
FIGS. 5A and 5B are cross-sectional views showing the step of segmenting the semiconductor devices according to the present invention into pieces.

FIGS. 5A and 5B are views showing the step of segmenting the semiconductor devices obtained by the steps shown in FIGS. 4A to 4E into pieces.

When at least the upper part of the adhesive is cut off along the cut lines CL shown in FIG. 5A, the semiconductor devices 20 are segmented into the respective pieces as shown in FIG. 5B.

Since the adhesive 3c that bonds the first flat plate 1a and the second flat plate 1b together is provided along the cut lines CL, the bonding surface part of the adhesive 3c that contributes to the bonding between the first flat plate 1a and the second flat plate 1b is removed at the cutting, whereby the first flat plate 1a and the second flat plate 1b are separated from each other. Thus, the semiconductor devices 20 with the support plate 1 that has a desired thickness shown in FIG. 1 can be obtained.

For example, when the support plate that has a total thickness of 300 μm is realized by a SUS plate that has a thickness of 50 μm to serve as the first flat plate 1a and a flat plate that has a thickness of 250 μm to serve as the second flat plate 1b, the same anti-warpage effect as that of one flat plate having a thickness of 300 μm is obtained. In addition, since only the first flat plate 1a that has a thickness of 50 μm remains in the semiconductor devices when the second flat plate 1b is separated from the semiconductor devices, the semiconductor devices can be made thinner.

Moreover, when the first flat plate is made of a material having excellent heat conduction, such as copper, semiconductor devices that have a low height and excellent radiation can be obtained.

Furthermore, since the second flat plate 1b is not cut off, it is reusable.

Fourth Embodiment

A fourth embodiment will be described based on FIGS. 6A and 6B.

The embodiment is one obtained by modifying a part of the third embodiment. In the embodiment, as shown in FIG. 6A, concave portions are provided in the second flat plate 1b along the cut lines CL, and the adhesive 3c is provided in the concave portions. Then, when at least the upper part of the adhesive is cut off along the cut lines CL shown in FIG. 6A as in the third embodiment, the first flat plate 1a and the second flat plate 1b can be separated from each other.

Thus, the semiconductor devices 20 with the support plate 1 that has a desired thickness shown in FIG. 1 can be obtained.

In addition, since the second flat plate 1b is not cut off, it is reusable.

Figures 6A, 6B:
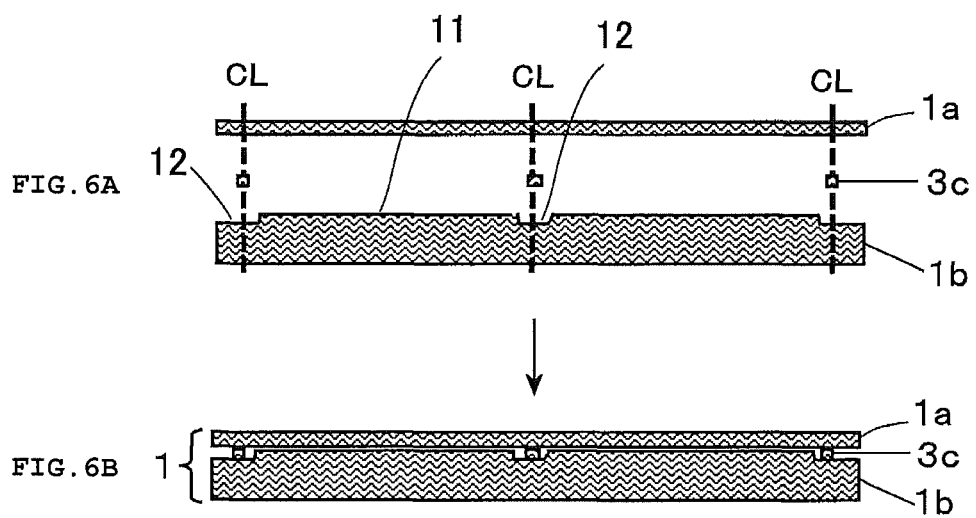
FIGS. 6A and 6B are cross-sectional views showing a configuration example of the combined support plate used in the method of manufacturing the semiconductor device according to the present invention.
Figure 8A:
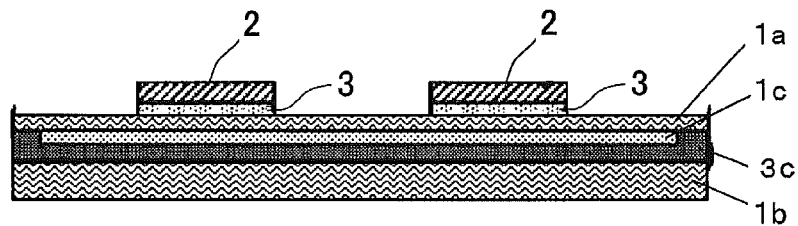
FIGS. 8A to 8E are cross-sectional views showing a part of the steps of the method of manufacturing the semiconductor device according to the present invention.
Figure 8B:
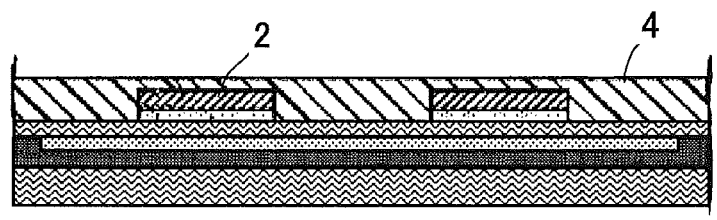
Figure 8C:
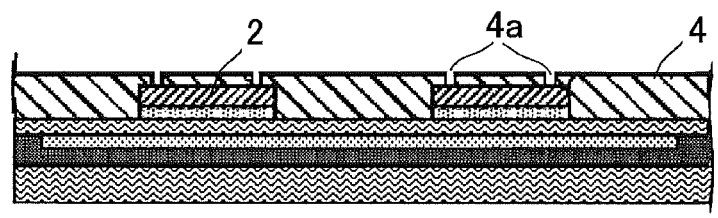
Figure 8D:
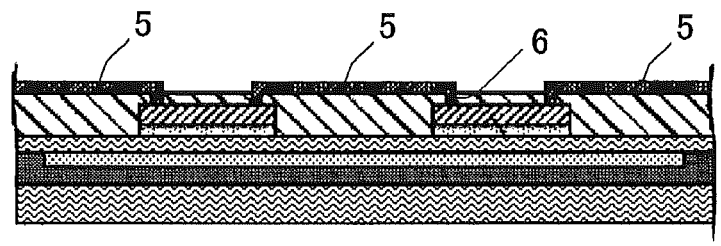
Figure 8E:
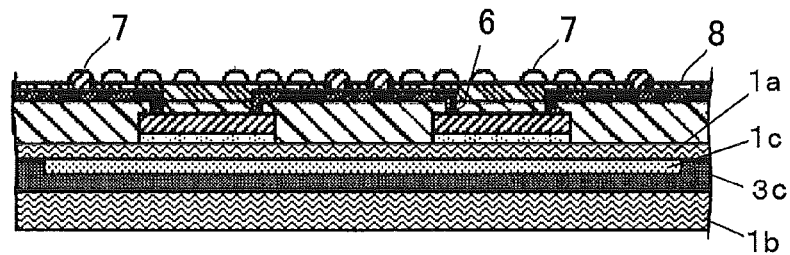

In the embodiment, as shown in FIG. 6B, the first flat plate 1a and the second flat plate 1b mostly come into direct contact with each other without the adhesive. Therefore, the integration between the first flat plate 1a and the second flat plate 1b is increased, and an anti-warpage effect is more enhanced.

Fifth Embodiment

A fifth embodiment will be described based on FIGS. 7A and 7B to FIGS. 9A and 9B.

In the embodiment, as shown in FIGS. 7A and 7B, the combined support plate 1 manufactured by the three flat plates 1a, 1b, and 1c in total is first used. In the combined support plate 1, the first flat plate 1a, the third flat plate 1c, and the second flat plate 1b are laminated to each other in this order, the third flat plate 1c is smaller in area than the first flat plate 1a and the second flat plate 1b, and the third flat plate does not exist on the periphery of the combined support plate 1.

The second flat plate 1b and the third flat plate 1c are bonded together via the adhesive 3c.

The first flat plate 1a and the third flat plate 1c come into direct contact with each other without the adhesive.

Further, a regional part on the periphery of the second flat plate 1b in which the third flat plate does not exist and a regional part on the periphery of the first flat plate in which the third flat plate does not exist are bonded together via the adhesive 3c, whereby the third flat plate 1c comes into intimate contact with the first flat plate 1a.

FIGS. 8A to 8E are views showing the steps of manufacturing the aggregate of the semiconductor devices, on which the plurality of semiconductor chips 2 are mounted, using the combined support plate 1. The details are the same as those described based on FIGS. 4A to 4E in the third embodiment except that the combined support plate shown in FIG. 7B is used as the combined support plate 1, the descriptions thereof will be omitted.

Figures 9A, 9B:
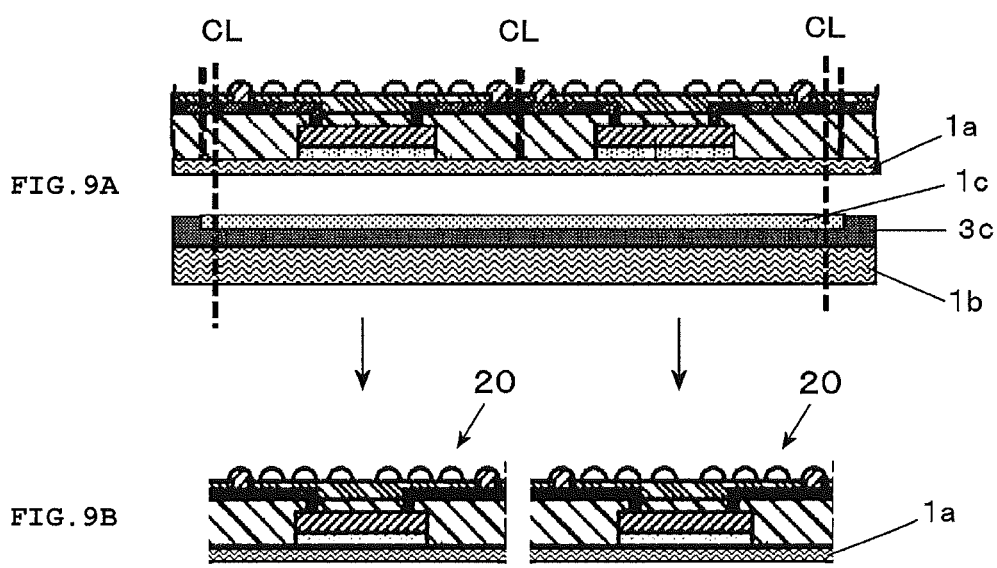
FIGS. 9A and 9B are cross-sectional views showing a part of the steps of the method of manufacturing the semiconductor device according to the present invention.

FIGS. 9A and 9B are views showing the step of separating the first flat plate 1a that constitutes the combined support plate 1 from the other flat plates 1b and 1c.

The combined support plate 1 of the embodiment has the laminated structure as described above. Therefore, when the combined support plate 1 is cut off together with the insulation material layer 4 at a part on the periphery of the combined support plate 1 in which the first flat plate 1a, the third flat plate 1c, and the second flat plate 1b exist in order to segment the semiconductor devices that include one or a plurality of semiconductor chips into pieces, a part in which the first flat plate 1a and the second flat plate 1b are bonded together is removed and also the first flat plate can be separated from the third flat plate and the second flat plate since the first flat plate 1a and the third flat plate 1c are not bonded together via the adhesive.

Sixth Embodiment

A sixth embodiment will be described based on FIGS. 10A to 10C and FIGS. 11A to 11C.

Figure 10A:
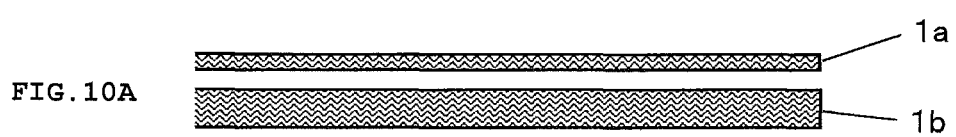
FIGS. 10A to 10C are cross-sectional views showing a configuration example of the combined support plate used in the method of manufacturing the semiconductor device according to the present invention.

In the embodiment, as shown in FIG. 10A, the first flat plate 1a and the second flat plate 1b are used as the combined support plate 1, and metal plates are used as the first flat plate 1a and the second flat plate 1b.

Figure 10B:
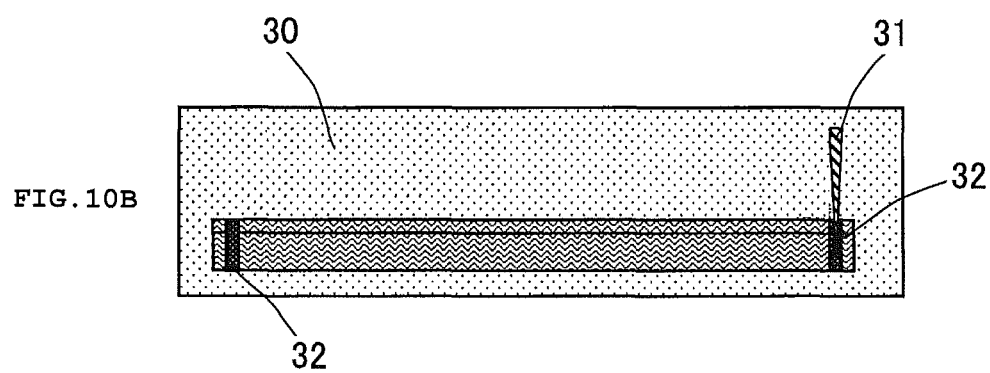

As shown in FIG. 10B, the first flat plate 1a and the second flat plate 1b are accommodated in a vacuum chamber 30 in an overlapped state. The vacuum chamber 30 is brought into a high vacuum state of 10-1 Pa to 10-3 Pa, and the periphery of the combined support plate 1 is welded by electron beams 31 at a position several mm away from the end thereof to form a welded part 32.

Figure 10C:
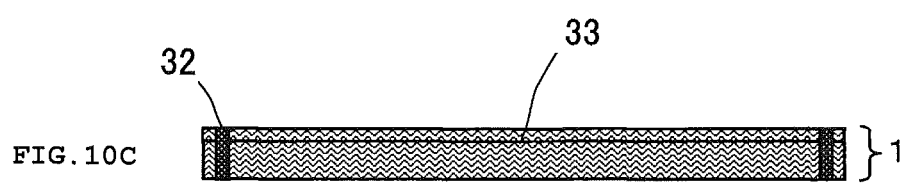

FIG. 10C shows the combined support plate 1 manufactured in the way described above. Since the periphery of the combined support plate 1 is welded by the electron beams 31 under a high vacuum atmosphere, the first flat plate 1a and the second flat plate 1b come into full contact with each other at a contact part 33 thereof. Thus, the first flat plate 1a and the second flat plate 1b come into direct contact with each other. Therefore, the integration between the first flat plate 1a and the second flat plate 1b is increased, and an anti-warpage effect is more enhanced.

In addition, since the welding width of the welded part 32 is only required to be about 1 mm, the combined support plate 1 is locally heated. Therefore, distortion caused by the welding can be made smaller than that caused by TIG welding or laser welding.

However, since the first flat plate 1a may be bored at the welding due to the gap between the flat plates when the first flat plate 1a is extremely thin, a jig by which the flat plates are caused to come into full contact with each other is required to prevent the flat plates from being bored.

FIG. 11A shows a state in which structures that include semiconductor chips are formed on the combined support plate 1 shown in FIG. 10C.

Since the steps of forming the structures are the same as those described based on FIGS. 4A to 4E in the manufacturing method of the third embodiment except that the combined support plate 1 is different, the descriptions thereof will be omitted.

In the aggregate of the semiconductor devices shown in FIG. 11A, the periphery of the combined support plate 1 is cut oft along the cut lines CL1 and CL2 as shown in FIG. 11B to remove the peripheries of the first flat plate 1a and the second flat plate 1b together with the welded part 32, whereby the first flat plate 1a and the second flat plate 1b are separated from each other. Next, as shown in FIG. 11C, the aggregate of the semiconductor devices is cut off along the cut line CL3 to be segmented into respective pieces.

Thus, the semiconductor devices 20 with the support plate 1 that has a desired thickness shown in FIG. 1 can be obtained.

Seventh Embodiment

An embodiment will be described based on FIGS. 12A to 12C and FIGS. 13A and 13B.

In the embodiment, the combined support plate 1 is constituted by the first flat plate 1a, the second flat plate 1b, and a temporary fixation film 11.

First, as shown in FIG. 12A, the first flat plate 1a, the temporary fixation film 11, and the second flat plate 1b are prepared.

Next, as shown in FIG. 12B, the temporary fixation film 11 is bonded onto one side of the second flat plate 1b.

Then, as shown in FIG. 12C, the first flat plate 1a is placed and bonded onto the temporary fixation film 11.

The temporary fixation film 11 is one obtained by providing adhesive layers on both front and rear surfaces of a substrate film and is commercially available.

Figures 13A, 13B:
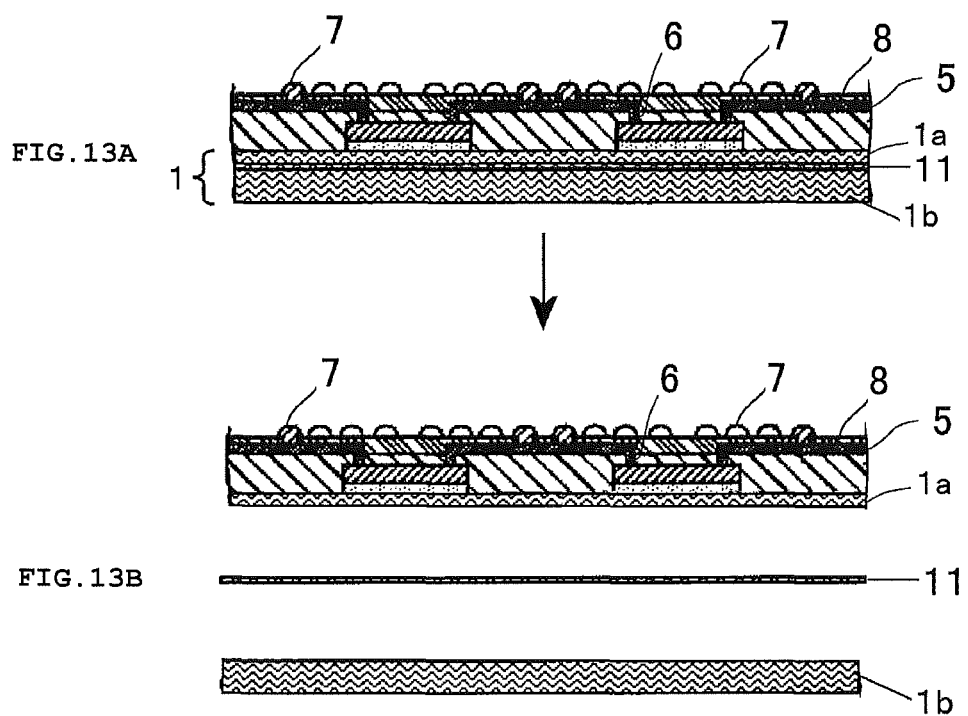
FIGS. 13A and 13B are views showing the step of separating a first flat plate from the combined support plate of the semiconductor devices.

FIG. 13A shows a state in which structures that include semiconductor chips are formed on the combined support plate 1 shown in FIG. 12C.

Since the steps of forming the structures are the same as those described based on FIGS. 4A to 4E in the third embodiment except that the combined support plate 1 is different, the descriptions thereof will be omitted.

As shown in FIG. 13B, the second flat plate 1b is separated from the temporary fixation film 11, and then the temporary fixation film attached onto the first flat plate 1a is separated from the first flat plate 1a. Thus, the semiconductor devices that have only the first flat plate 1a as a support plate are obtained.

Figures 14A, 14B:
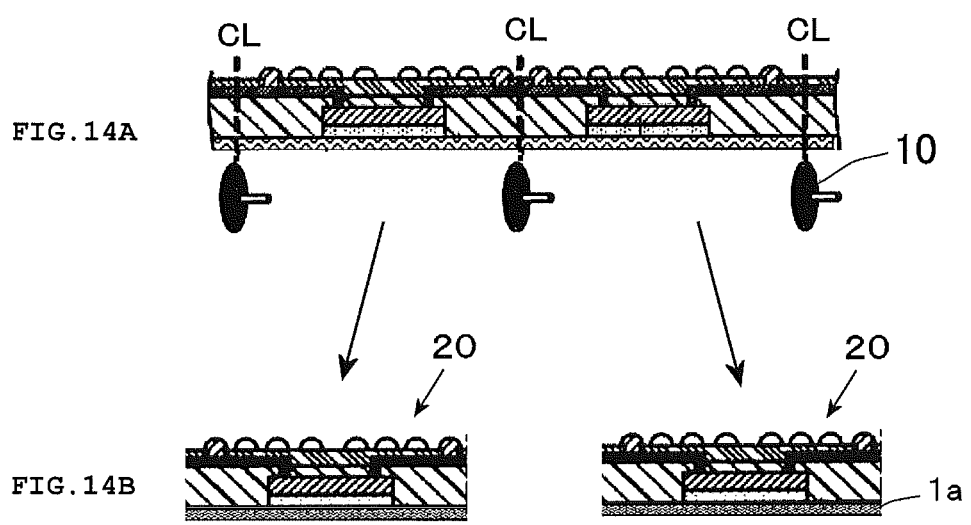
FIGS. 14A and 14B are cross-sectional views showing the step of segmenting the semiconductor devices according to the present invention into pieces.

FIGS. 14A and 14B are views showing the step of segmenting the semiconductor devices shown in FIG. 13B into pieces.

When the semiconductor devices are segmented into the pieces along the cut lines CL using a blade 10 as shown in FIG. 14A, the semiconductor devices 20 segmented into the pieces as shown in FIG. 14B can be obtained.

Eighth Embodiment

An embodiment will be described based on FIG. 15.

Figure 15:
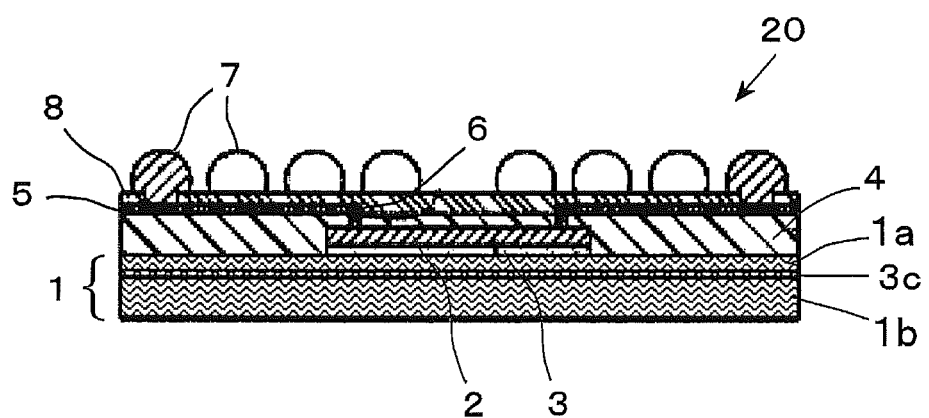
FIG. 15 is a cross-sectional view showing a configuration example of a semiconductor device according to the present invention.

FIG. 15 is a vertical cross-sectional view showing the embodiment of a semiconductor device according to the present invention.

A semiconductor device 20 shown in FIG. 15 has a support plate 1 in which a plurality of flat plates (two plates in FIG. 15) is laminated to each other, a semiconductor chip 2, an insulation material layer 4, a wiring layer 5, and external electrodes 7.

The semiconductor chip 2 is arranged on the principal surface of the support plate 1 with the element circuit surface thereof having an electrode (not shown) directed upward, and the surface (rear surface) opposite to the element circuit surface of the semiconductor chip 2 is bonded onto the support plate 1 via an adhesive 3.

On the entire principal surface of the support plate 1, an insulation material layer 4 is formed so as to cover the element circuit surface of the semiconductor chip 2. A wiring layer 5 that constitutes a wiring made of a conductive metal such as copper is formed on the insulation material layer 4 and partially withdrawn to the peripheral region of the semiconductor chip 2. The insulation material layer on the electrode of the semiconductor chip 2 has openings, and conductive portions 6 are formed in the openings to electrically connect the wiring layer 5 and the electrode to each other. In addition, a plurality of external electrodes 7, such as solder balls, are formed at the prescribed positions of the wiring layer 5.

On the insulation material layer 4 and the wiring layer 5 that does not include the bonding parts of the external electrodes 7, the wiring protection layer 8 is formed. The wiring protection layer 8 may be made of a material the same as or different from the insulation material of the insulation material layer 4.

In the semiconductor device of the embodiment, a combined support plate in which a plurality of flat plates (a first flat plate 1a and a second flat plate 1b) are laminated to each other is used as the support plate 1. In the semiconductor device, warpage occurs due to a difference in the heat expansion coefficient between members when the semiconductor device is heated in a manufacturing process. The support plate requires a certain degree of stiffness to prevent the warpage. Therefore, when SUS is, for example, employed as a material of the support plate, a support plate that has a thickness of about 0.3 mm has been conventionally used. However, since the SUS is poor in heat conduction, it is not suitable as the radiation plate of the semiconductor device.

In addition, although it is expected to use a support plate made of copper having an excellent heat conduction, a thick copper plate is required to enhance stiffness. However, the copper plate cannot be employed due to its poor workability.

Therefore, in the embodiment, the combined support plate in which the plurality of flat plates are laminated to each other to have a stiffness and prevent the warpage is used as the support plate of the semiconductor device, and the first flat plate 1a on which the semiconductor chip is mounted is made of a material having a high heat conduction such as copper. With this configuration, a semiconductor device that

Ninth Embodiment

Figure 16:
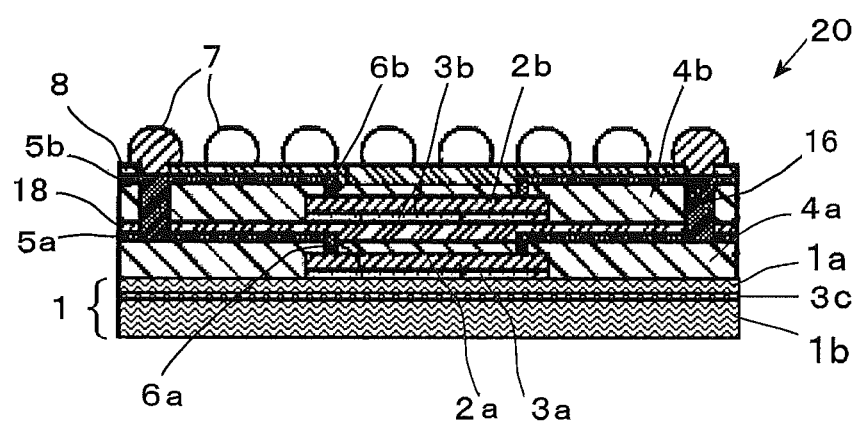
FIG. 16 is a cross-sectional view showing a configuration example of a semiconductor device according to the present invention.
Figure 18A:
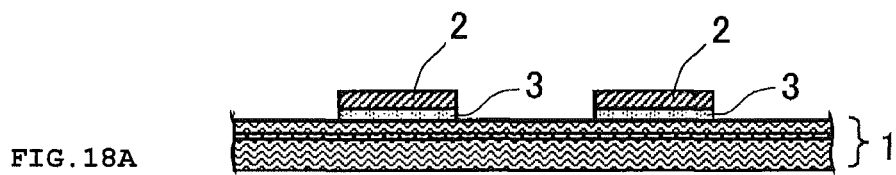
FIGS. 18A to 18E are cross-sectional views showing a part of the steps of the method of manufacturing the semiconductor device according to the present invention.
Figure 18B:
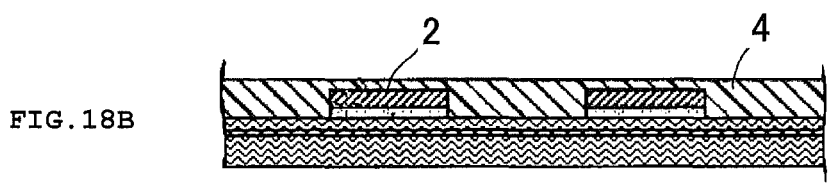
Figure 18C:
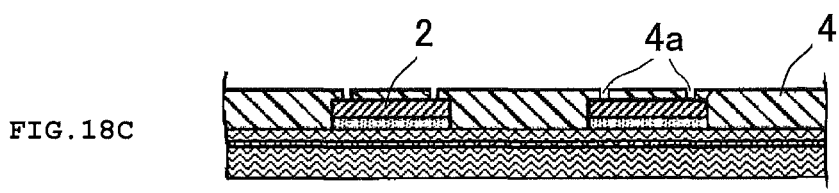
Figure 18D:
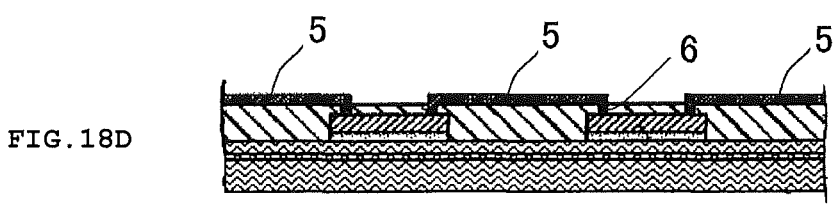
Figure 18E:
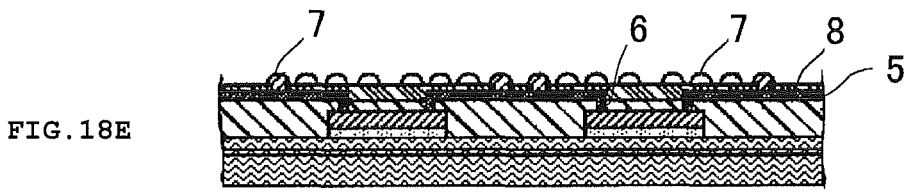

FIG. 16 is a cross-sectional view showing a ninth embodiment of the present invention.

A semiconductor device 20 of the embodiment has a structure in which two semiconductor chips 2 (a first semiconductor chip 2a and a second semiconductor chip 2b) are laminated and arranged. The first semiconductor chip 2a is bonded onto one principal surface of a support plate 1 in the same manner as that of the eighth embodiment with the element circuit surface thereof directed upward, an insulation material layer (first insulation material layer) 4a is formed on the first semiconductor chip 2a so as to cover the same, and a first wiring layer 5a that has conductive portions 6a on the electrode of the first semiconductor chip 2a is formed on the insulation material layer 4a. Further, an interlayer insulation protection layer 18 is formed on the first insulation material layer 4a and the first wiring layer 5a that does not include the connection parts (interlayer via connection parts) of interlayer via portions 16 that will be described later.

Moreover, the second semiconductor chip 2b is bonded onto the interlayer insulation protection layer 18 with the element circuit surface thereof directed upward, and an insulation material layer (second insulation material layer) 4b is formed so as to cover the second semiconductor chip 2b. Note that the second insulation material may be the same as or different from the first insulation material.

Further, a second wiring layer 5b is formed on the second insulation material layer 4b, and conductive portions 6b that electrically connect the second wiring layer 5b and the electrode of the second semiconductor chip 2b to each other are formed. In addition, in the peripheral region of the second semiconductor chip 2b, openings are formed in the second insulation material layer 4b so as to suit via connection parts opened and formed in the interlayer insulation protection layer 18, and the interlayer via portions 16 that electrically connect the first wiring layer 5a and the second wiring layer 5b to each other are formed in the openings. Moreover, external electrodes 7 such as solder balls are formed at the prescribed positions of the second wiring layer 5b, and a wiring protection layer 8 is formed on the second insulation material layer 4b and the second wiring layer 5b that does not include the connection parts of the external electrodes 7.

In the embodiment thus configured, the semiconductor device that has the structure in which the two semiconductor chips 2a and 2b are laminated and arranged, has a high connection reliability between the electrodes of the respective semiconductor chips 2 and the wiring layers, is capable of responding to the miniaturization of the electrodes and can be obtained at a high yield and a low cost.

Note that although the ninth embodiment shows the structure in which the two semiconductor chips 2 are laminated and arranged, a structure in which three or more semiconductor chips are laminated and arranged may be employed. In the case of the structure in which three or more semiconductor chips are laminated to each other, the same structures as the structure in which the second semiconductor chip 2b, the second insulation material layer 4, the second wiring layer 5b, and the interlayer via portions 16 are laminated to each other are laid one on another by the number of the semiconductor chips. Further, a wiring protection layer is formed on the outermost wiring layer, and the external electrodes 7 are formed at prescribed positions. In this way, the semiconductor device is completed.

The embodiment of the method of manufacturing the semiconductor device of the eighth embodiment will be described based on FIGS. 17A and 17B to FIGS. 19A and 19B.

In the manufacturing method that will be described below, the support plate 1 is much greater in size than the semiconductor chips 2 of the present invention, and the plurality of semiconductor chips 2 are mounted on the support plate 1 with an interval placed therebetween and subjected to prescribed treatment steps to simultaneously manufacture the plurality of semiconductor devices. The plurality of semiconductor devices are finally segmented into separate semiconductor devices. As a result, the plurality of semiconductor devices can be obtained.

Since the plurality of semiconductor devices are simultaneously manufactured in this way, it becomes possible to remarkably reduce their manufacturing cost.

In addition, although the semiconductor device that has one semiconductor chip on the support plate will be described in the following embodiment, a case in which a plurality of semiconductor chips are formed on the support plate is also an embodiment of the present invention.

FIGS. 17A and 17B are views showing the configuration of a combined support plate 1.

The combined support plate 1 is laminated in such a way that a first flat plate 1a and a second flat plate 1b are bonded together via an adhesive 3c.

The first flat plate 1a and the second flat plate 1b are flat plates that have a uniform thickness. The first flat plate 1a is made of a material having a higher heat conduction than the second flat plate 1b and preferably made of copper. The second flat plate 1b is preferably made of a resin cured body made of a cured insulation resin or a metal such as stainless steel and 42 alloy. The combined support plate 1 should be such that the total thickness of the first flat plate 1a and the second flat plate 1b is a thickness at which warpage does not occur due to the formation of an insulation material layer that will be described later.

FIGS. 18A to 18E are views showing the steps of manufacturing the semiconductor devices before segmentation.

The details are the same as those described based on FIGS. 4A to 4E in the third embodiment except that the combined support plate shown in FIG. 17B is used as the combined support plate 1, the descriptions thereof will be omitted.

Figures 19A, 19B:
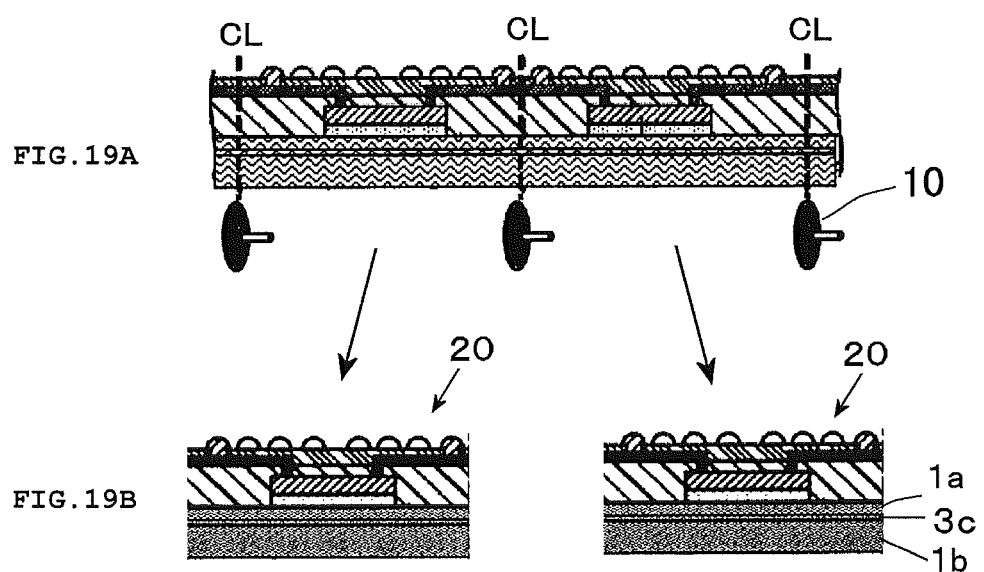
FIGS. 19A and 19B are cross-sectional views showing the step of segmenting the semiconductor devices according to the present invention into pieces.
Figure 20:
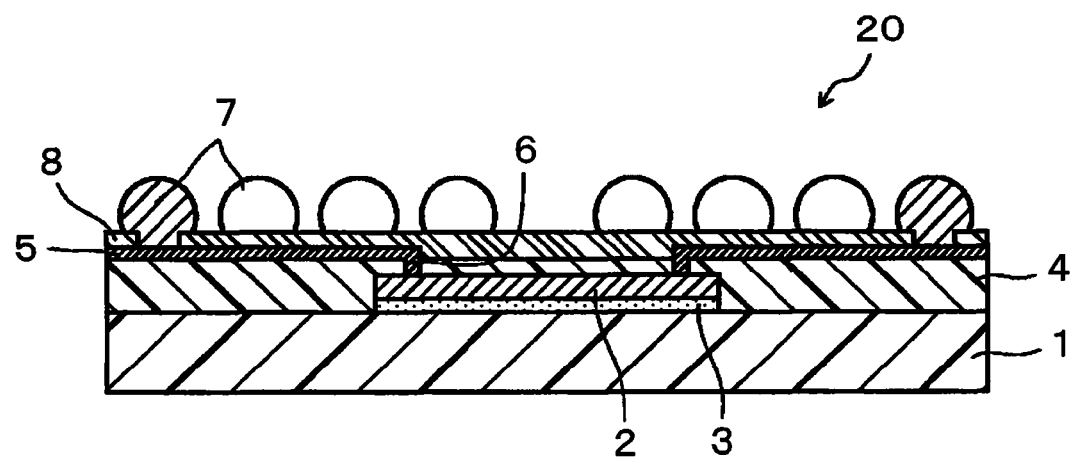
FIG. 20 is a view showing the structure of a conventional semiconductor device.

FIGS. 19A and 19B are views showing the step of segmenting the semiconductor devices 20 obtained by the steps shown in FIGS. 18A to 18E into pieces.

When being cut off along cut lines CL as shown in FIG. 19A, the semiconductor devices 20 are segmented into the pieces as shown in FIG. 19B.

What is claimed is:
1. A semiconductor device including:
   a support plate having a thickness of no more than 50 µm;
   a semiconductor chip mounted on a principal surface of the support plate via an adhesive layer, with an element circuit surface of the chip being directed upward;
   an insulation material layer that seals the semiconductor chip and a periphery of the semiconductor chip;
   openings formed on an electrode arranged on the element circuit surface of the semiconductor chip in the insulation material layer;
   conductive portions formed in the openings so as to be connected to the electrode of the semiconductor chip;

a wiring layer formed on the insulation material layer so as to be connected to the conductive portions and partially extending to a peripheral region of the semiconductor chip; and external electrodes formed on the wiring layer, wherein the support plate is a flat plate that has the semiconductor chip mounted thereon and is separated from other flat plates that constitute a combined support plate, the flat plate constituting the combined support plate in which the plurality of flat plates used in a process of manufacturing the semiconductor device is laminated to each other, the adhesive layer is present on the support plate only where the semiconductor chip is mounted; and the semiconductor device is free from warpage.

2. A method of manufacturing the semiconductor device according to claim 1, the method including:

a step of laminating a plurality of flat plates to each other to manufacture a combined support plate;

a step of positioning and arranging a plurality of semiconductor chips on a principal surface of a first flat plate that constitutes the combined support plate and bonding surfaces opposite to element circuit surfaces of the semiconductor chips via an adhesive;

a step of forming an insulation material layer on the element circuit surfaces of the semiconductor chips and the principal surface of the first flat plate;

a step of forming openings in the insulation material layer at positions on the electrodes arranged on the element circuit surfaces of the semiconductor chips;

a step of forming a wiring layer that partially extends to peripheral regions of the semiconductor chips on the insulation material layer, and forming conductive portions connected to the electrodes of the semiconductor chips in the openings of the insulation material layer;

a step of forming external electrodes on the wiring layer;

a step of cutting off the first flat plate and the insulation material layer at prescribed positions to segment the semiconductor devices that include the one or the plurality of semiconductor chips into pieces; and a step of separating a flat plate other than the first flat plate among the plurality of flat plates that constitutes the combined support plate from the semiconductor devices before or after the step of segmenting the semiconductor devices that include the one or the plurality of semiconductor chips into the pieces.

3. The method of manufacturing the semiconductor device according to claim 2, wherein the combined support plate is obtained by laminating the first flat plate and a second flat plate to each other via the adhesive, and the adhesive is removed to separate the flat plate other than the first flat plate from the semiconductor devices.

4. The method of manufacturing the semiconductor device according to claim 3, wherein the adhesive between the first flat plate and the second flat plate is provided along cut lines used to segment the semiconductor devices that include the one or the plurality of semiconductor chips into the pieces and this adhesive between the first flat plate and the second flat plate is cut off together with the first flat plate and the insulation material layer when the semiconductor devices that include the one or the plurality of semiconductor chips are segmented into the pieces, thereby separating the first flat plate and the second flat plate from each other.

5. The method of manufacturing the semiconductor device according to claim 4, wherein concave portions are provided in the second flat plate along the cut lines, and the adhesive is provided in the concave portions.

6. The method of manufacturing the semiconductor device according to claim 2, wherein the combined support plate is obtained by laminating the first flat plate, a third flat plate, and a second flat plate to each other in this order, the third flat plate is smaller in area than the first flat plate and the second flat plate, the second flat plate and the third flat plate are bonded together via the adhesive, the first flat plate and the third flat plate come into direct contact with each other without the adhesive, a regional part of the second flat plate in which the third flat plate does not exist and a regional part of the first flat plate in which the third flat plate does not exist are bonded together via the adhesive, and a regional part in which the first flat plate, the third flat plate, and the second flat plate are laminated to each other is cut off together with the first flat plate and the insulation material layer when the semiconductor devices that include the one or the plurality of semiconductor chips are segmented into the pieces, thereby separating the first flat plate from the third flat plate and the second flat plate.

7. The method of manufacturing the semiconductor device according to claim 2, wherein the combined support plate is laminated in such a way that the first flat plate and a second flat plate are welded to each other at outer peripheral parts thereof in a state of coming into intimate contact with each other, and the outer peripheral parts in which the first flat plate and the second flat plate are welded to each other are cut off and removed when the semiconductor devices that have the one or the plurality of semiconductor chips are segmented into the pieces, thereby separating the first flat plate and the second flat plate from each other.

8. The method of manufacturing the semiconductor device according to claim 3, wherein the combined support plate has the first flat plate and the second flat plate bonded together via a temporary fixation film that has adhesion, and the first flat plate is separated from the temporary fixation film when the semiconductor devices that include the one or the plurality of semiconductor chips are segmented into the pieces, thereby separating the first flat plate and the second flat plate from each other.

9. The semiconductor device of claim 1, wherein the support plate is made of copper.

10. The semiconductor device of claim 1, wherein the support plate has a thickness of 50 μm.

* * * * *